United States Patent [19]

Noomem

[11] 4,340,453

[45] Jul. 20, 1982

[54] U.V.-CURABLE RESIN WITH AMINE ACCELERATOR

[75] Inventor: Arie Noomem, Voorhout, Netherlands

[73] Assignee: Akzo N.V., Arnhem, Netherlands

[21] Appl. No.: 138,684

[22] Filed: Apr. 9, 1980

[30] Foreign Application Priority Data

Apr. 10, 1979 [NL] Netherlands ..................... 7902797

[51] Int. Cl.$^3$ ........................... C08F 2/50; C08K 5/34
[52] U.S. Cl. ........................... 204/159.15; 204/159.18; 204/159.23; 427/54.1; 525/21; 525/22; 525/26; 526/204; 526/208; 526/301; 528/54
[58] Field of Search ..................... 204/159.21, 159.23, 204/159.18; 548/323

[56] References Cited

U.S. PATENT DOCUMENTS

| | | | |
|---|---|---|---|
| 4,071,424 | 1/1978 | Dart et al. | 204/159.19 |
| 4,077,858 | 3/1978 | Costanza et al. | 204/159.23 |
| 4,089,763 | 5/1978 | Dart et al. | 204/159.24 |
| 4,266,005 | 5/1981 | Nakamura et al. | 204/159.18 |

OTHER PUBLICATIONS

Astle et al., "Organic Chemistry", IInd Ed. 1959; Harper Bros., pp. 138, 139, 296, 297, 477.
Chemische Berichte 95 (1962), pp. 1493-1494, Volpp.
Makromolecular Chem. 17 (1955), pp. 77-130, Krassig.

*Primary Examiner*—John C. Bleutge
*Assistant Examiner*—Arthur H. Koeckert
*Attorney, Agent, or Firm*—Stevens, Davis, Miller & Mosher

[57] ABSTRACT

A coating composition is disclosed which is curable under the influence of ultraviolet light and which comprises a U.V.-curable binder, a photoinitiator and as accelerator a polycyclic condensation product of formaldehyde or acetaldehyde and an aliphatic or cycloaliphatic diprimary 1,2-diamine. The U.V.-curable binder is preferably an adduct containing at least one isocyanate group of (a) an acrylic or methacrylic hydroxy ester having 5 to 20 carbon atoms and (b) a polyisocyanate having 4 to 44 carbon atoms and 2 to 4 isocyanate groups.

13 Claims, No Drawings

U.V.-CURABLE RESIN WITH AMINE ACCELERATOR

This invention relates to a coating composition which can be cured under the influence of ultraviolet light and is based on a U.V.-curable binder, a photoinitiator and a nitrogen-containing accelerator. In known compositions use is made generally of an aromatic carbonyl compound as photoinitiator, and of an alkylamine or an alkanolamine as accelerator; see e.g. U.S. Pat. No. 4,077,858. Upon curing pigmented or non-pigmented compositions this combination leads to coatings having a good surface hardness. A drawback, however, is that these accelerators are generally insufficiently compatible with U.V.-curable binders, so that hazing takes place in the coating of the cured composition or exudation of the accelerator as a result of migration of these accelerators. Another drawback consists in that when alkanolamines are used it is not possible to choose any U.V.-curable binder; no use can be made for instance of a binder with isocyanate groups and/or epoxy groups, because the resulting reaction between such components would cause the composition to have an inadmissibly short storage life.

An object of the present invention is to provide a composition which does not show the above-mentioned drawbacks and retains the advantage of rapid and proper curing.

The composition according to the invention is characterized in that the accelerator is a polycyclic condensation product of formaldehyde and/or acetaldehyde and an aliphatic and/or cycloaliphatic diprimary 1,2-diamine.

As a binder generally any U.V.-curable binder may be chosen. As examples of suitable binders may be mentioned unsaturated polyester resins and alkyd resins, unsaturated melamine-formaldehyde resins, polybutadiene resins and unsaturated compounds such as (meth)acrylates and allyl compounds.

As examples of illustrative U.V.-curable polyesters may be mentioned polycondensation products from unsaturated di- or polycarboxylic acids or derivatives thereof, for instance: maleic acid, maleic anhydride, fumaric acid, and polyols such as ethylene glycol, 1,2-propane diol, diethylene glycol, 1,3-propylene glycol, polyethylene glycol, hexane diol, glycerol, trimethylol propane and/or pentaerythritol. Besides the unsaturated carboxylic acids there may be present saturated carboxylic acids, for instance: synthetic and/or natural fatty acids, benzoic acid, isononanoic acid, malonic acid, glutaric acid, adipic acid, azelaic acid, sebacic acid, tetrahydrophthalic acid, phthalic acid, phthalic anhydride, isophthalic acid, terephthalic acid, hexachlorendomethylene tetrahydrophthalic acid and/or trimellitic acid. Usually these polyesters are mixed with unsaturated monomeric compounds having vinyl groups and/or allyl groups. As monomeric compounds as a rule styrene, vinyl toluene and/or methyl methacrylate are employed.

Illustrative (meth)acrylates and allyl compounds are for example methylacrylate, methyl methacrylate, ethyl acrylate, ethyl methacrylate, butyl acrylate; (meth)acrylic esters of aliphatic diols and/or polyols, for instance: ethylene diacrylate, trimethylol propane triacrylate and pentaerythritol tetraacylate; hydroxy(meth)acrylates such as hydroxyethyl acrylate, 3-hydroxypropyl acrylate, 3-hydroxypropyl methacrylate, 4-hydroxybutyl acrylate and pentaerythritol triacrylate and allyl compounds such as diallyl phthalate, diallyl maleate, triallyl isocyanurate and ethylene glycol diallyl ether. Optionally, these compounds may be mixed with possibly smaller amounts of monomers such as acrylonitrile, methacrylonitrile, acrylamide, methacrylamide, N,N-disubstituted acrylamides and methacrylamides, vinyl acetate, succinic divinyl ester, isobutyl vinyl ether, 1,4-butane diol divinyl ether, styrene, alkyl styrene, halogen styrene, divinyl benzene, vinyl naphthalene and N-vinyl pyrrolidone.

It is preferred, however, that the binder to be used should be an urethan acrylate resin, more particularly an at least one isocyanate group-containing adduct of (a) an acrylic or methacrylic hydroxy ester having 5 to 20 carbon atoms and (b) a polyisocyanate having 4 to 44 carbon atoms and 2 to 4 isocyanate groups. As examples of suitable isocyanate compounds may be mentioned hexamethylene diisocyanate, 2,2,4-trimethylhexane-1,6-diisocyanate, 2,4,4-trimethylhexane-1,6-diisocyanate, cyclohexyl-1,4-diisocyanate, isophoron diisocyanate, the adduct of 1 molecule of 1,4-butane diol and 2 molecules of isophoron diisocyanate, the adduct of 1 molecule of 1,4-butane diol and 2 molecules of hexamethylene diisocyanate, dicyclohexyl methane-4,4'-diisocyanate, xylylene diisocyanate, 1,3,5-trimethyl-(2,4-ω-diisocyanatomethyl)-benzene, toluenediisocyanate, diphenylmethane-4,4'-diisocyanate, the triisocyanate of a lysine ester, the adduct of 3 molecules of hexamethylene diisocyanate and 1 molecule of water, the adduct of 1 molecule of trimethylol propane and 3 molecules of isophoron diisocyanate, the adduct of 1 molecule of trimethylol propane and 3 molecules of toluene diisocyanate and the adduct of 1 molecule of pentaerythritol and 4 molecules of hexamethylene diisocyanate. As examples of suitable hydroxy(meth)acrylates containing at least one hydroxy group may be mentioned 2-hydroxyethyl acrylate, 2-hydroxyethyl methacrylate, 3-hydroxypropyl methacrylate, 4-hydroxybutyl acrylate, 12-hydroxydodecanyl acrylate, 2-hydroxy-3-chloropropyl acrylate, trimethylol propane diacrylate, trimethylol propane dimethacrylate, pentaerythritol diacrylate and pentaerythritol triacrylate. Use of the above-mentioned urethan acrylate resins offers the advantage that the polycyclic polycondensation product used as accelerator is chemically bonded in the final coating layer, as a result of which undesirable plasticizing effect is avoided. The use of such a compound has the additional advantage that it results in an increase in the molecular weight of the isocyanate compound, so that the physical properties and the durability of the coating are further improved.

Other binders that are preferably used in the coating composition according to the invention are unsaturated epoxy resins; for instance those that are obtained by addition of (meth)acrylic acid or of a half ester of a polyvalent carboxylic acid and a hydroxy acrylate compound to an epoxy compound having 2 or more epoxy groups. As examples of suitable epoxy compounds may be mentioned: 1,4-butane diol diglycidyl ether and the diglycidyl ethers of 4,4-dihydroxydiphenyl-2,2-propane, 1,1'-isopropylidene-bis-(p-phenyleneoxy)-2-diethanol and 1,1'-isopropylidene-bis-(p-phenyleneoxy)-2-dipropanol. Alternatively, it is of course also possible to use mixtures of unsaturated polymers in combination, if desired, with saturated polymers, or to employ UV-curable mixtures of polymers and saturated or unsaturated monomeric compounds.

Suitable photoinitiators are for example: aromatic carbonyl compounds such as benzil, benzil dimethyl ketal, acetophenone, substituted acetophenones, thioxanthone and chlorothioxanthone. It is preferred that use should be made of benzophenone. Optionally, use may be made of coloured compounds such as aromatic azo compounds and compounds such as benzoin and ethers thereof, such as the methyl ether, the ethyl ether, the propyl ether and the tert.butyl ether. Also mixtures of photoinitiators may be used. The photoinitiator is usually present in an amount of 0.05 to 10% by weight, based on the U.V.-curable binder.

According to the invention the polycyclic polycondensation product to be used as accelerator in the photoinitiator system is built up on the one hand from formaldehyde and/or acetaldehyde and on the other hand from an aliphatic and/or cycloaliphatic diprimary 1,2-diamine. The 1,2-diamine generally contains 2-26 carbon atoms and, more particularly, 2-12 carbon atoms. As examples of very suitable 1,2-diamines may be mentioned: 1,2-ethylenediamine, 1-cyano-1,2-diaminoethane, 1,2-propylenediamine, 1,2-dimethyl-1,2-ethylenediamine, 1,2-butylenediamine, 1,2-diaminohexane and 1,2-diaminocyclohexane. It is preferred that ethylenediamine and/or 1,2-propylenediamine should be used.

In the preparation of the polycyclic polycondensation product the formaldehyde and/or the acetaldehyde and the 1,2-diamine(s) are generally employed in amounts of 1-5 moles, and preferably 1-3 moles, and more particularly 2 moles of the aldehyde per mole of the diamine. The structure of the products formed in the polycondensation reaction may vary with the nature of the diamine used. It is preferred that the products to be obtained should not contain C=N groups and the N-atoms should be of a tertiary nature.

It is preferred that the polycondensation reaction should be carried out in the presence of an inorganic or organic solvent, and preferably in water. Alternatively, mixtures may be used. The use of a solvent, however, is optional. The polycondensation reaction may be accelerated by means of a basic catalyst, for instance: sodium hydroxide or potassium hyroxide. The reaction is usually carried out at a temperature in the range of $-20°$ to $150°$ C., and preferably between $0°$ and $100°$ C., more particularly at ambient temperature. The preparation of the polycyclic polycondensation product is known in itself and is described in Ber. Chem. Ges. 95 (1962), p. 1493 and in Makromol. Chem. 17, pp. 77-130 (1955).

When use is made of binders which are not reactive towards the accelerator, the accelerator is usually employed in an amount of about 0.1-10% by weight, based on the binder. When use is made of reactive binders, such as those having isocyanate groups or epoxy groups, the accelerator is usually employed in an amount of 0.7 to 1.3 equivalent per equivalent of the binder.

The coating composition may, if desired, still contain other additives, for example: pigment dispersing agents, levelling agents, fillers, pigments, dyes, polymerization inhibitors and inert or reactive solvents.

Applying the coating composition to the desired substrate may be effected in any convenient manner, for instance by roller coating, brushing, sprinkling, flow coating, dipping, curtain coating or spraying. The coating composition may be applied to any substrate, for instance to a plastics material, chip board, board, wood and preferably to metal substrates as coating in an automobile paint system.

As a U.V.-radiation source may for instance serve a mercury or xenon lamp operating at high, medium or low pressure. The composition need be exposed to radiation generally only for a few seconds up to a few minutes. The ultraviolet light employed usually has a wave length of 90-600 nm.

The invention is further described but not limited by the following examples. In them the hardness of the cured coating was measured in accordance with the Persoz method and is expressed in seconds. The gloss and the appearance were determined visually.

The condensation product of formaldehyde and ethylenediamine used as accelerator in the examples was prepared as follows. To 125 grammes of ethylene diamine and 25 grammes of NaOH in 1500 ml of water there was slowly added dropwise at $20°-30°$ C. a mixture of 240 g of a 40%-aqueous formaldehyde solution and 150 g of water. After a reaction time of 20 hours at room temperature most of the water was distilled off, followed by filtration and washing the filtrate with dioxane.

EXAMPLE I

A mixture of 100 parts by weight of a 60% by weight solution of the adduct of 1 mole of hexamethylene diisocyanate and 2 moles of pentaerythritol triacrylate, 2 parts by weight of benzophenone and 2 parts by weight of the condensation product as accelerator was applied to a degreased steel panel to a layer thickness of 30 m (in the cured state).

For comparison the procedure used in Example I was repeated, except that use was made of 2.0 parts by weight of dimethylethanolamine as accelerator.

The mixtures were subjected to radiation for 10 seconds by a high-pressure mercury-vapour lamp (of the HOK 80 W/cm type made by Philips), with the lamp being positioned at a distance of 40 cm from the substrate. The results are given in Table 1.

TABLE 1

| Example | Hardness | Gloss | Appearance |
|---|---|---|---|
| Example I | 135 | excellent | excellent |
| Comparative Example A | 124 | moderate | exudation symptoms |

EXAMPLE II

The procedure used in Example I was repeated, except that use was made of a 70% by weight solution of the reaction product of 1 mole of diglycidyl ether of bisphenol A (available under the trade name Epikote 828 of Shell) and 2 moles of acrylic acid in polyethylene glycol diacrylate.

For comparison, the procedure used in Example II was repeated, except that use was made of dimethylethanolamine as accelerator in an amount of 2.0 parts by weight. The results are given in Table 2.

TABLE 2

| Example | Hardness | Gloss | Appearance |
|---|---|---|---|
| Example II | 85 | excellent | excellent |
| Comparative Example B | 77 | moderate | exudation symptoms |

EXAMPLE III

A 70% by weight solution of the reaction product of 1 mole of the adduct of 3 molecules of hexamethylene diisocyanate and 1 mole of water with 1½ moles of pentaerythritol triacrylate in butyl acrylate was mixed with an equivalent amount (calculated on free NCO) of the condensation product as accelerator. The composition thus obtained was applied to a degreased steel panel to a layer thickness of 30 μm (in the cured state) and subjected to radiation for 10 seconds by a high-pressure mercury-vapor lamp (of the HOK type made by Philips), which was positioned at a distance of 40 cm from the substrate. The cured layer was tack-free. The Persoz hardness was determined immediately after irradiation, after 4 hours and after 1 day, respectively. The results are given in Table 3. From these results it can be derived that the condensation product of formaldehyde and ethylenediamine is an effective accelerator and from the increasing hardness of the coating it follows that its reaction with the isocyanate compound is attended with an increase in the molecular weight of the isocyanate compound.

TABLE 3

| | Hardness | | |
|---|---|---|---|
| Example | immediately after irradiation | after 4 hours | after 1 day |
| Example III | 73 | 127 | 162 |

EXAMPLE IV

An epoxy acrylate resin having a free epoxy group was prepared as follows:

A mixture of 380 g of diglycidyl ether of Bisphenol A (marketed by Shell under the trade name Epikote 828) and 72 g of acrylic acid was dissolved in 150 g of toluene. There were added 1.8 g of benzyltrimethyl ammonium methoxide as catalyst and 0.44 g of tert.butyl hydroquinone as inhibitor. The mixture was heated to 80° C., with stirring and passing through a stream of nitrogen. Of the product obtained after 5 hours the acid number had dropped to 5.4. To 100 g of this binder there was added a stoichiometric amount (calculated on free epoxy groups) of the condensation product as accelerator and 2% by weight of benzophenone. The resulting composition was applied to a degreased steel panel to a thickness of 30 μm (in the cured state) and subsequently passed under a high-pressure UV-lamp of the HOK type at a distance of 40 cm from it and at a speed of 3.5 m/minute. The hardness was determined immediately after irradiation and after 1, 2, 4 and 7 days. The hardness was again found to increase.

TABLE 4

| | Hardness | | | | |
|---|---|---|---|---|---|
| Example | immediately after irradiation | after 1 day | after 2 days | after 4 days | after 7 days |
| Example IV | 50 | 62 | 81 | 111 | 135 |

What is claimed is:

1. A coating composition which is curable under the influence of ultraviolet light and is based on a U.V.-curable binder, a photoinitiator and a nitrogen-containing accelerator, characterized in that the accelerator is a polycyclic condensation product of formaldehyde and/or acetaldehyde and an aliphatic and/or cycloaliphatic diprimary 1,2-diamine.

2. The coating composition of claim 1, wherein the accelerator is built up from formaldehyde and/or acetaldehyde and from a diamine having 2-26 carbon atoms.

3. The coating composition of claim 1, wherein the diamine contains 2-12 carbon atoms.

4. The coating composition of claim 1, wherein the diamine is ethylenediamine and/or 1,2-propylenediamine.

5. The coating composition of claim 1, wherein the accelerator is the polycondensation product of 1-5 moles of formaldehyde and/or acetaldehyde and 1 mole of diamine.

6. The coating composition of claim 1, wherein the accelerator is the polycondensation product of 1-3 moles of formaldehyde and/or acetaldehyde and 1 mole of diamine.

7. The coating composition of claim 1, wherein the UV-curable binder is an at least one isocyanate group-containing adduct of
   (a) an acrylic or methacrylic hydroxy ester having 5 to 20 carbon atoms and
   (b) a polyisocyanate having 4 to 44 carbon atoms and 2 to 4 isocyanate groups.

8. The coating composition of claim 1, wherein the UV-curable binder is an unsaturated epoxy resin.

9. A coating composition adapted to be cured on a substrate by exposure to ultraviolet light comprising an ultra violet light curable ethylenically unsaturated resin, a photoinitiator and a 1,4-endomethylene-1,4-diazacyclopentane or a 1,4-endoethylidene-1,4-diazacyclopentane accelerator.

10. The coating composition of claim 9 containing an ethylenically unsaturated monomer in mixture with said resin.

11. The coating composition of claim 10 wherein the said ethylenically unsaturated resin is a reaction product of an unsaturated polyester and an organic polyisocyanate, said reaction product having at least one unreacted-NCO group, and the accelerator is the reaction product of ethylene diamine or propylene diamine with formaldehyde or acetaldehyde having the formula

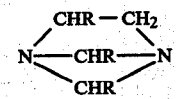

wherein R is hydrogen or methyl.

12. A process for coating a substrate which comprises applying to the substrate the composition of claim 9 and exposing the resulting coating to ultraviolet light until the coating is cured.

13. A process for coating a substrate which comprises applying to the substrate the composition of claim 11 and exposing the resulting coating to ultraviolet light until the coating is cured.

* * * * *